(12) United States Patent
Shim

(10) Patent No.: US 8,093,625 B2
(45) Date of Patent: Jan. 10, 2012

(54) NITRIDE SEMICONDUCTOR LIGHT EMITTING DEVICE AND METHOD FOR FABRICATING THE SAME

(75) Inventor: Sang Kyun Shim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/637,151

(22) Filed: Dec. 12, 2006

(65) Prior Publication Data

US 2007/0131953 A1    Jun. 14, 2007

(30) Foreign Application Priority Data

Dec. 13, 2005    (KR) .................. 10-2005-0122371

(51) Int. Cl.
*H01L 21/02*    (2006.01)
(52) U.S. Cl. ............. 257/190; 257/79; 257/94; 257/96; 257/97; 257/103; 257/E21.124; 257/E21.125; 257/E33.025; 257/E33.028; 257/E33.03; 257/E33.033; 257/E33.034

(58) Field of Classification Search .............. 257/79, 257/94, 96, 97, 103, 190, E21.124, E21.125, 257/E33.025, E33.028, E33.03, E33.033, 257/E33.034
See application file for complete search history.

(56) References Cited

U.S. PATENT DOCUMENTS

| 6,841,800 B2 * | 1/2005 | Oku et al. .................. 257/94 |
| 2002/0158253 A1 * | 10/2002 | Moku et al. .................. 257/76 |
| 2003/0057434 A1 * | 3/2003 | Hata et al. .................. 257/103 |
| 2004/0119063 A1 * | 6/2004 | Guo et al. .................. 257/13 |
| 2005/0118752 A1 * | 6/2005 | Otsuka et al. .................. 438/172 |
| 2005/0221520 A1 * | 10/2005 | Ou et al. .................. 438/29 |
| 2006/0068601 A1 * | 3/2006 | Lee et al. .................. 438/761 |

* cited by examiner

*Primary Examiner* — Jay C Kim
(74) *Attorney, Agent, or Firm* — Birch, Stewart, Kolasch & Birch, LLP

(57) ABSTRACT

Disclosed is a nitride semiconductor light emitting device. The nitride semiconductor light emitting device comprises a buffer layer having a super-lattice layer on a silicon substrate, a first conductive clad layer on the buffer layer, an active layer on the first conductive clad layer, and a second conductive clad layer on the active layer.

12 Claims, 5 Drawing Sheets

(a)                          (b)

(a)

(b)

NITRIDE SEMICONDUCTOR LIGHT EMITTING DEVICE AND METHOD FOR FABRICATING THE SAME

BACKGROUND OF THE INVENTION

1. Field of the Invention

The present invention relates to a nitride semiconductor light emitting device and a method for fabricating the same.

2. Description of the Related Art

Generally, a light emitting diode (LED) is one of the well-known semiconductor light emitting devices. The LED is used to send and receive signal by converting the electric signal into infrared radiation, visible radiation, or light using the characteristic of a compound semiconductor.

The LED is used in various fields such as home electronics, remote controllers, electronic display boards, indicators, automated machines, and so on, and is generally classified into an infrared emitting diode and a visible light emitting diode.

Typically, the downsized LED is made in the type of a surface mount device in order to directly mount it on a printed circuit board. Thus, an LED lamp used as a display device is being developed in the surface mount device type. This surface mount device can replace an existing simple on/off lamp, and is used as an on/off indicator, a character indicator, an image indicator, etc. producing various colors.

As the LED is widely used as described above, the brightness required for an electric light used in everyday life or an emergency signal light is gradually increased. Recently, a high-power LED has been actively developed.

Hereinafter, a related light emitting device will be described with reference to the attached drawings.

FIG. 1 is a sectional view illustrating a related nitride semiconductor light emitting device.

Referring to FIG. 1, the related nitride semiconductor light emitting device has a buffer layer 30, an n-type clad layer 40, an active layer 50, and a p-type clad layer 60, which are sequentially formed on a sapphire ($Al_2O_3$) substrate 10.

Then, a p-type electrode 90 is formed on the p-type clad layer 60, and an n-type electrode 80 is formed at one side on the n-type clad layer 40.

When voltage is applied to the n-type electrode 80 and the p-type electrode 90, electrons are injected from the n-type clad layer 40 into the active layer 50, and holes are injected from the p-type clad layer 60 into the active layer 50.

At this time, the electrons and holes injected into the active layer 50 are recombined to produce light having energy corresponding to a band gap difference or an energy level difference.

However, the related nitride semiconductor light emitting device mainly employs sapphire ($Al_2O_3$) in order to grow a good quality of nitride semiconductor. The production cost of this sapphire is high, and thus the cost of the light emitting device is increased.

Further, the related sapphire substrate has low electrical and thermal conductivities in itself, and thus results in low heat release. Hence, the light emitting device has a short lifetime, and is difficult to secure its reliability.

Because the related sapphire substrate itself has high insulating property, it can be applied only to a device having a photoelectric characteristic. For this reason, the related sapphire substrate is impossible to fabricate micro-electromechanical system (MEMS) devices and micro optoelectronic integrated circuit (OEIC) devices having the photoelectric characteristic and a combination of electrical and electronic characteristics.

SUMMARY OF THE INVENTION

Accordingly, the invention is related to a nitride semiconductor light emitting device and a method for fabricating the same, in which a nitride semiconductor is stacked on a silicon substrate, thereby improving electrical and optical characteristics and reliability of the light emitting device.

According to an embodiment of the present invention, a nitride semiconductor light emitting device comprises a buffer layer having a super-lattice layer on a silicon substrate, a first conductive clad layer on the buffer layer, an active layer on the first conductive clad layer, and a second conductive clad layer on the active layer.

According to another embodiment of the present invention, a method for fabricating a nitride semiconductor light emitting device comprises the steps of forming a buffer layer having a super-lattice layer on a silicon substrate, forming a first conductive clad layer on the buffer layer, forming an active layer on the first conductive clad layer, and forming a second conductive clad layer on the active layer.

BRIEF DESCRIPTION OF THE DRAWINGS

FIG. 4 is an optical microscope photograph showing the surface of a first conductive clad layer as a GaN epitaxial layer, wherein FIG. 4(a) is for the case where an undoped GaN layer 220 is interposed between AlN/GaN SL layers, and FIG. 4(b) is for the case where only an AlN/GaN SL layer is formed;

DETAILED DESCRIPTION OF THE PREFERRED EMBODIMENTS

Hereinafter, a nitride semiconductor light emitting device and a method for fabricating the same in accordance with an embodiment of the present invention will be described in detail with reference to the accompanying drawings.

In the following description of an embodiment of the present invention, when a layer is formed "on" another layer, it may be formed directly on the other layer, or one or more intervening layer may be present.

Further, the light emitting device will be described as employing gallium nitride (GaN), but it is not limited to this. Therefore, the present invention can be applied to the nitride semiconductor light emitting device using groups 3 and 5 compounds such as gallium nitride (GaN), aluminum nitride (AlN), indium nitride (InN), and the like.

Figure 1:
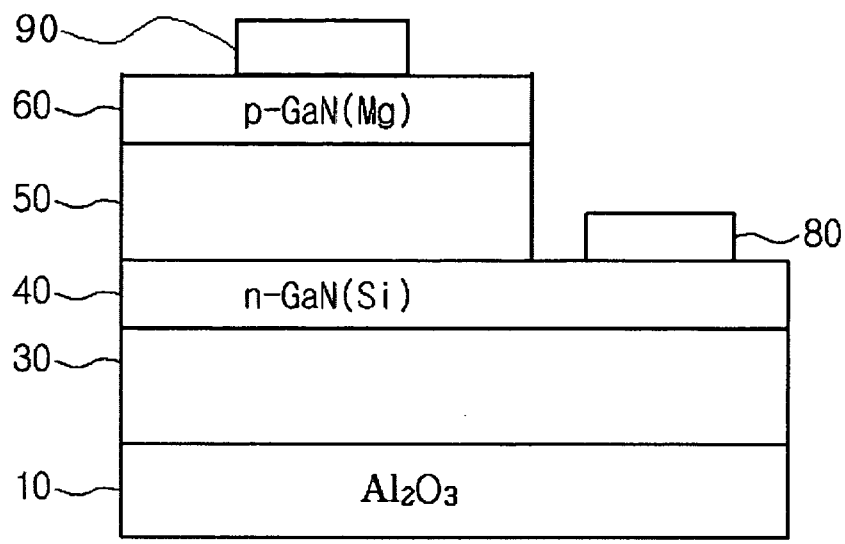
FIG. 1 is a sectional view illustrating a related nitride semiconductor light emitting device.
Figure 2:
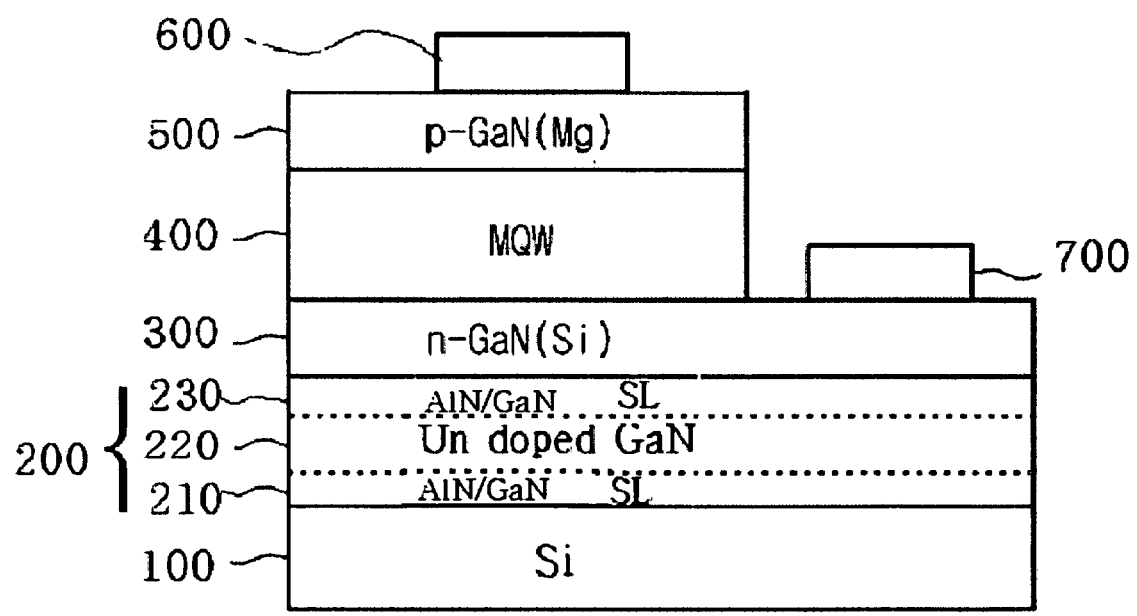
FIG. 2 is a sectional view illustrating a nitride semiconductor light emitting device according to an embodiment of the present invention.

FIG. 2 is a sectional view illustrating a nitride semiconductor light emitting device according to an embodiment of the present invention.

As illustrated in FIG. 2, the nitride semiconductor light emitting device comprises a silicon substrate 100, a buffer layer 200 having a super-lattice layer on the silicon substrate 100, a first conductive clad layer 300 on the buffer layer 200, an active layer 400 on the first conductive clad layer 300, and a second conductive clad layer 500 on the active layer 400.

Here, the first conductive clad layer 300 and the second conductive clad layer 500 can be composed of a plurality of layers.

A first conductive electrode 700 and a second conductive electrode 600 are formed on the first conductive clad layer 300 and the second conductive clad layer 500, respectively.

For example, the first conductive clad layer 300 may be an n-type GaN layer into which silicon (Si), a dopant, is doped, and the second conductive clad layer 500 may be a p-type GaN layer into which magnesium (Mg) is doped.

Although the case where the first conductive clad layer 300 is an n type, whereas the second conductive clad layer 500 is a p type, is taken by way of example, the present invention is not limited to this. In other words, when the first conductive clad layer 300 is the p type, the second conductive clad layer 500 is the n type.

The active layer 400 is formed on the first conductive clad layer 300, and the second conductive clad layer 500 is formed on the active layer 400. The active layer 400 and the second conductive clad layer 500 are etched such that part of the first conductive clad layer 300 is exposed, and the first conductive electrode 700 is formed on the exposed part of the first conductive clad layer 300.

The active layer 400 has a multiple quantum well (MQW) structure, in which holes flowing through the second conductive electrode 600 and electrons flowing through the first conductive electrode 700 are combined to produce light.

Meanwhile, a transparent ohmic electrode (not shown) may be additionally formed on the second conductive clad layer 500, and then the second conductive electrode 600 may be formed on the transparent ohmic electrode.

Figure 7:
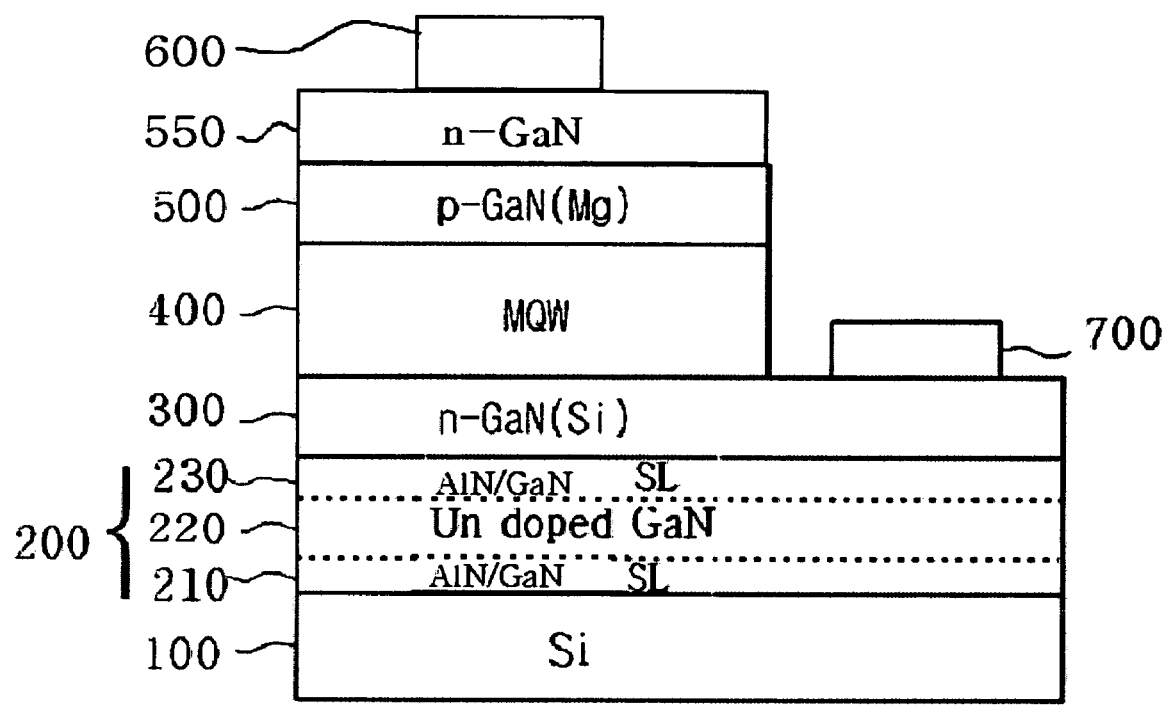
FIG. 7 is a sectional view illustrating a nitride semiconductor light emitting device according to another embodiment of the present invention.

Of course, as in FIG. 7, a third conductive clad layer 550 may be additionally formed on the second conductive clad layer 500. At this time, when the second conductive clad layer 500 is the p type, the third conductive clad layer 550 is the n type.

When voltage is applied to the first conductive electrode 700 and the second conductive electrode 600, the electrons are injected from the first conductive clad layer 300 into the active layer 400, while the holes are injected from the second conductive clad layer 500 into the active layer 400.

At this time, the electrons and the holes injected into the active layer 400 are recombined to produce light.

Here, a high quality of nitride semiconductor layer free of lattice defects or cracks must be grown in order to form a high luminosity of light emitting device on the silicon substrate 100.

To this end, the buffer layer 200 is formed as a super-lattice (SL) layer. The SL layer 200 is composed of multiple layers. A first SL layer 210 having an AlN/GaN structure is formed on the silicon substrate 100. For example, in the first embodiment of the present invention, the AlN/GaN SL layer as the first SL layer 210 can be grown at five periods at a temperature of 1050° C. to 1070° C.

The buffer layer 200 of the present invention can be formed at high temperature of 1000° C. or more, unlike that of the related art which is mainly formed at low temperature.

Figure 3:
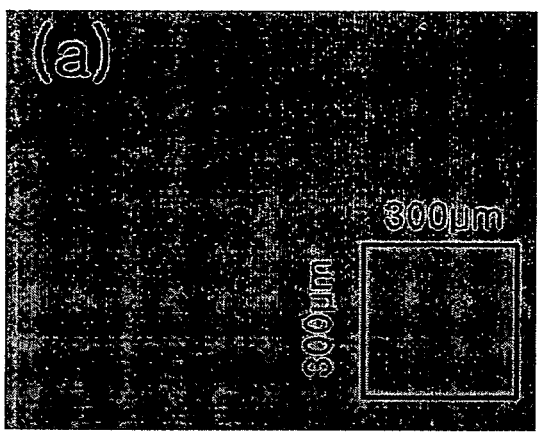
FIG. 3 is an optical microscope photograph showing the surface of a first conductive clad layer as a GaN epitaxial layer according to the number of periods of various super-lattice structures.
Figure 3:
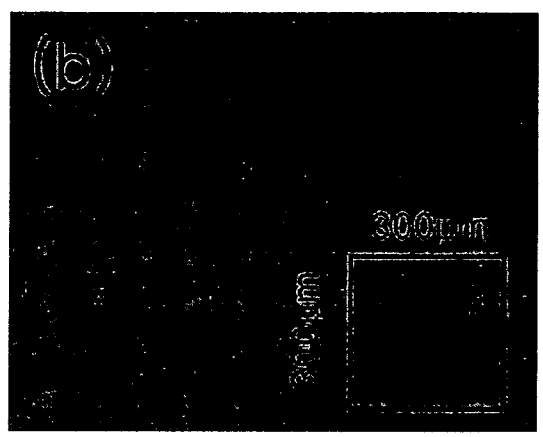
Figure 3:
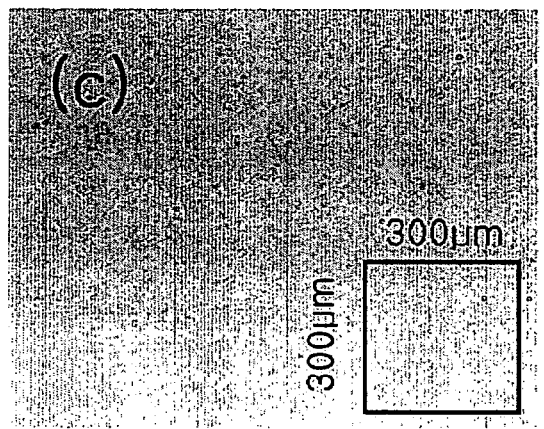

FIG. 3 is an optical microscope photograph showing the surface of a first conductive clad layer 300, a GaN epitaxial layer, according to the number of periods of various super-lattice structures.

FIG. 3(a) is an optical microscope photograph showing a surface on which a first conductive clad layer 300 grown above a Si substrate does not rise to any crack although formed at a thickness of 2 µm when an AlN/GaN SL layer is formed at five periods.

In contrast, FIG. 3(b) is applied to the case where the AlN/GaN SL layer is formed at ten periods. FIG. 3(c) is applied to the case where the AlN/GaN SL layer is formed at 15 periods, wherein the first conductive clad layer 300 gives rise to cracks on the surface thereof, and is not grown properly.

Next, an undoped GaN layer 220 is grown on the first SL layer 210.

Figure 4:
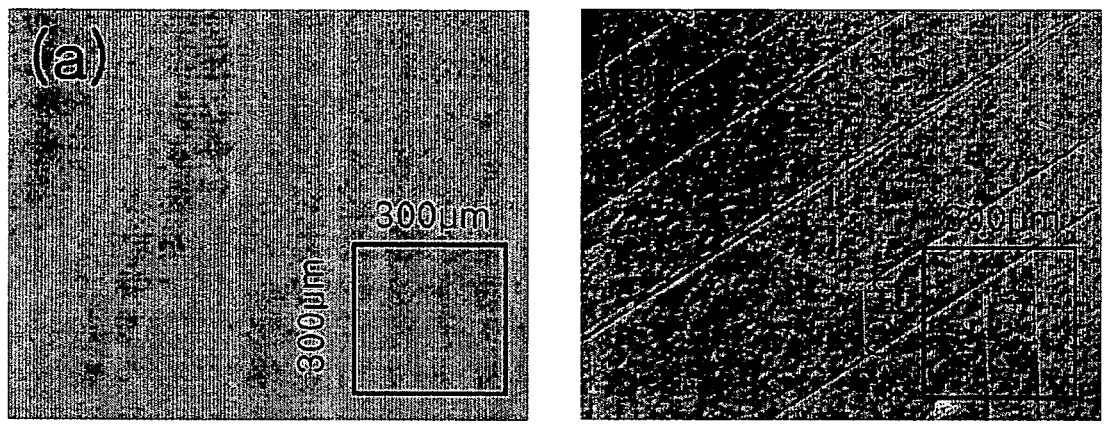

FIG. 4(a) is an optical microscope photograph showing the surface of a first conductive clad layer 300, a GaN epitaxial layer, in the case where an undoped GaN layer 220 is interposed between AlN/GaN SL layers, and FIG. 4(b) is applied to the case where only an AlN/GaN SL layer is formed.

The undoped GaN layer 220 is formed between the AlN/GaN SL layers 210 and 230. This is because the cracks take place in the case of the buffer layer using only AlN/GaN as in FIG. 4(b).

The cracks are caused by a lattice mismatch between the silicon substrate 100 and the AlN/GaN SL layer.

Specifically, as in FIG. 4(a), the AlN/GaN SL is grown as the first SL layer 210, and then the undoped GaN layer 220 is grown on the first SL layer 210. Thereby, threading dislocation occurring at the lower layer is prevented, and a quality of crystal is improved.

Next, a second SL layer 230 having the AlN/GaN structure is deposited on the undoped GaN layer 220. At this time, the second SL layer 230 can be formed at five or more periods on the same process conditions as the first SL layer 210. For example, in the embodiment of the present invention, the second SL layer 230 can be formed at five periods.

Figure 5:
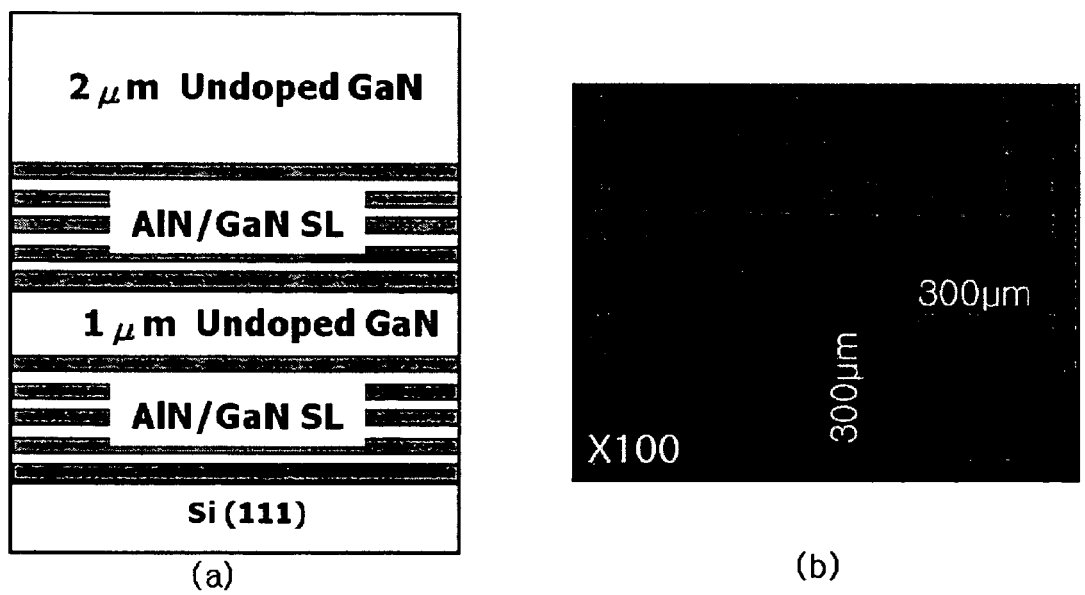
FIG. 5 includes FIG. 5(b) which is an optical microscope photograph showing the surface of a first conductive clad layer as a GaN epitaxial layer in the case of using AlN/GaN SL stack layer in accordance with an embodiment of the present invention as shown in FIG. 5(a)

FIG. 5(b) is an optical microscope photograph showing the surface of a first conductive clad layer 300, a GaN epitaxial layer, in the case of using AlN/GaN SL stack layer on a silicon layer 111, as shown in FIG. 5(a), according to an embodiment of the present invention.

Here, when the buffer layer 200 is formed as a stack layer of the first SL layer 210, the undoped GaN layer 220, and the second SL layer 230, the following process can be performed without a crack.

FIG. 6(b) is an optical microscope photograph showing a surface of a GaN epitaxial layer when an AlN/GaN SL layer is formed only underneath the GaN epitaxial layer and on a silicon layer 111, as shown in FIG. 6(a), unlike an embodiment of the present invention.

Figure 6:
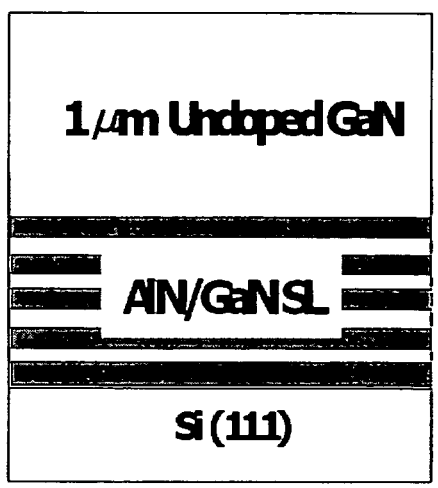
FIG. 6 includes FIG. 6(b) which is an optical microscope photograph showing a surface of a GaN epitaxial layer when an AlN/GaN SL layer is formed only underneath the GaN epitaxial layer as shown in FIG. 6(a) and unlike an embodiment of the present invention.
Figure 6:
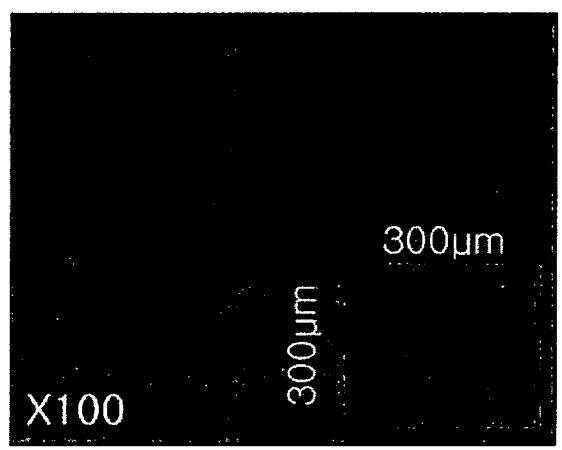

In other words, as in FIG. 6, in the case of forming only the first SL layer 210, the cracks take place.

As described above, in the nitride semiconductor light emitting device according to an embodiment of the present invention, the AlN/GaN SL layer is used to form a high quality of nitride semiconductor layer on the silicon substrate 100, so that the defects are eliminated from the internal structure of the light emitting device, and the electrons and holes injected into the active layer are easily used. As a result, the nitride semiconductor light emitting device has excellent optical property.

Further, because the silicon substrate has electrical and thermal conductivities higher than those of the sapphire substrate, so that a process time is shortened. Because the silicon substrate can be chemically removed, so that the strain or stress caused by removal of the substrate can be remarkably reduced.

In addition, the inexpensive silicon substrate can be used instead of the expensive sapphire substrate, much time can be shortened during the process, and the production cost can be lowered.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A nitride semiconductor light emitting device comprising:
    a buffer layer having a super-lattice layer deposited on a silicon substrate;
    a first conductive clad layer on the buffer layer;
    an active layer on the first conductive clad layer; and
    a second conductive clad layer on the active layer,
    wherein the buffer layer comprises:
        a first AlN/GaN super-lattice layer directly on the silicon substrate;
        an undoped Gallium nitride semiconductor layer directly on the first AlN/GaN super-lattice layer; and
        a second AlN/GaN super-lattice layer directly on the undoped Gallium nitride semiconductor layer,
    wherein the undoped Gallium nitride semiconductor layer is thicker than a GaN layer of the first AlN/GaN super-lattice layer and a GaN layer of the second AlN/GaN super-lattice layer,
    wherein a surface area of the undoped Gallium nitride semiconductor layer is substantially equal to a surface area of the first AlN/GaN super-lattice layer or the second AlN/GaN super-lattice layer, and
    wherein the first conductive clad layer is formed directly on the second AlN/GaN super-lattice layer.

2. The nitride semiconductor light emitting device as claimed in claim 1, wherein the first and second super-lattice layers are each formed of at least five periods of an AlN/GaN structure.

3. The nitride semiconductor light emitting device as claimed in claim 1, further comprising a third conductive clad layer on the second conductive clad layer.

4. The nitride semiconductor light emitting device as claimed in claim 1, wherein the undoped Gallium nitride semiconductor layer is formed at a thickness of about 0.8 μm to about 1.2 μm.

5. A method for fabricating a nitride semiconductor light emitting device, the method comprising:
    forming a buffer layer having a super-lattice layer on a silicon substrate;
    forming a first conductive clad layer on the buffer layer;
    forming an active layer on the first conductive clad layer; and
    forming a second conductive clad layer on the active layer,
    wherein the step of forming the buffer layer comprises the sub-steps of:
        forming a first AlN/GaN super-lattice layer directly on the silicon substrate;
        forming an undoped Gallium nitride semiconductor layer directly on the first AlN/GaN super-lattice layer; and
        forming a second AlN/GaN super-lattice layer directly on the undoped Gallium nitride semiconductor layer;
    wherein the first conductive clad layer is formed directly on the second AlN/GaN super-lattice layer,
    wherein the undoped Gallium nitride semiconductor layer is thicker than a GaN layer of the first AlN/GaN super-lattice layer and a GaN layer of the second AlN/GaN super-lattice layer, and
    wherein a surface area of the undoped Gallium nitride semiconductor layer is substantially equal to a surface area of the first AlN/GaN super-lattice layer or the second AlN/GaN super-lattice layer.

6. The method as claimed in claim 5, wherein the first and second super-lattice layers are each formed of five or more periods of an AlN/GaN structure.

7. The method as claimed in claim 5, further comprising forming a third conductive clad layer on the second conductive clad layer.

8. The method as claimed in claim 5, wherein the undoped Gallium nitride semiconductor layer is formed at a thickness of about 0.8 μm to about 1.2 μm.

9. The method as claimed in claim 5, wherein the first conductive clad layer has a thickness of 2 μm or more.

10. The method as claimed in claim 5, wherein the first super-lattice layer and the second super-lattice layer are grown on the same process conditions.

11. The method as claimed in claim 5, wherein one of the first and second AlN/GaN super-lattice layers is grown at high temperature of 1000° C.

12. The method as claimed in claim 5, wherein one of the first and second AlN/GaN super-lattice layers is grown at a temperature of about 1050° C. to about 1070° C.

* * * * *